United States Patent
Senn

[19]

[11] Patent Number: 6,041,938
[45] Date of Patent: Mar. 28, 2000

[54] COMPLIANT PROCESS CASSETTE

[75] Inventor: Anthony Senn, Boise, Id.

[73] Assignee: SCP Global Technologies, Boise, Id.

[21] Appl. No.: 08/920,347

[22] Filed: Aug. 27, 1997

Related U.S. Application Data

[60] Provisional application No. 60/024,999, Aug. 29, 1996.
[51] Int. Cl.[7] .............................. B65D 85/30; A47F 5/00
[52] U.S. Cl. ........................ 206/711; 118/500; 206/445; 206/454; 211/41.18
[58] Field of Search ............................ 134/201; 118/500, 118/728; 211/41.18, 40, 41.12, 124, 171; 206/454, 711, 334, 445

[56] References Cited

U.S. PATENT DOCUMENTS

| | | |
|---|---|---|
| 2,840,256 | 6/1958 | Cobb, Jr. . |
| 3,486,631 | 12/1969 | Rodman . |
| 3,682,083 | 8/1972 | Puente . |
| 3,889,815 | 6/1975 | Merle ................................ 206/454 X |
| 4,182,265 | 1/1980 | Bracher ................................ 118/500 |
| 4,191,295 | 3/1980 | Tams, III ............................ 206/454 X |
| 4,572,101 | 2/1986 | Lee . |
| 4,653,636 | 3/1987 | Armstrong . |
| 4,679,689 | 7/1987 | Blome . |
| 4,872,554 | 10/1989 | Quernemoen . |
| 4,981,222 | 1/1991 | Lee ..................................... 211/41.18 |
| 5,054,626 | 10/1991 | Stempinski .............................. 211/40 |
| 5,159,946 | 11/1992 | Seiichiro . |
| 5,370,142 | 12/1994 | Nishi et al. . |
| 5,379,785 | 1/1995 | Ohmori et al. . |
| 5,503,173 | 4/1996 | Kudo et al. . |
| 5,551,459 | 9/1996 | Ohmori et al. . |

*Primary Examiner*—Bryon P. Gehman
*Attorney, Agent, or Firm*—Limbach & Limbach

[57] ABSTRACT

A cassette for supporting substantially planar objects such as photomasks, glass plates or semiconductor wafers during processing. The cassette is composed of bars connected at each end to an endpiece. Arms which form part of the endpiece are hinged to permit the side bars of the cassette to move inwardly and outwardly from one another when objects are inserted in the cassette. A bridge can connect an upper portion of the arms. The bridge can be used to lift the cassette and cause flexing of the cassette to ensure better retention while the cassette is being lifted.

19 Claims, 15 Drawing Sheets

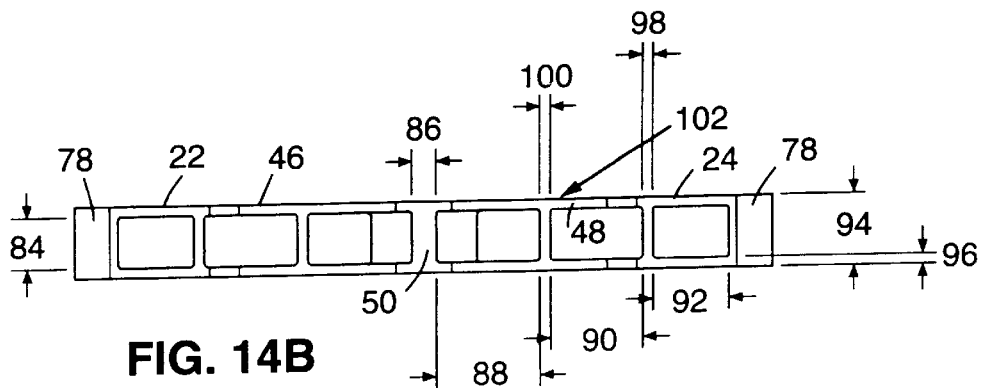
FIG. 14B
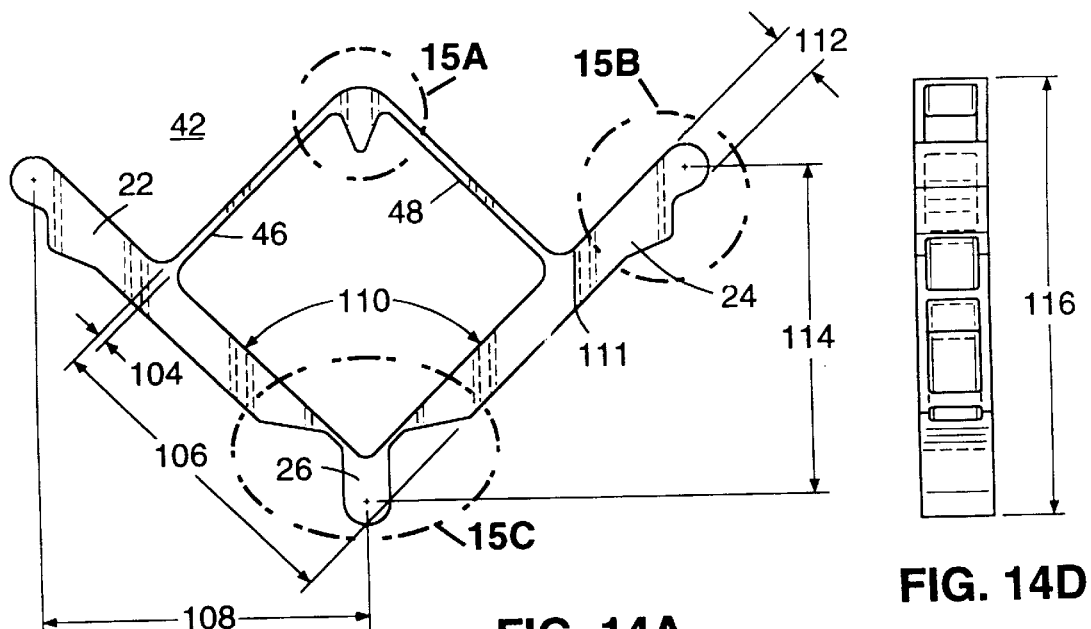
FIG. 14A
FIG. 14D
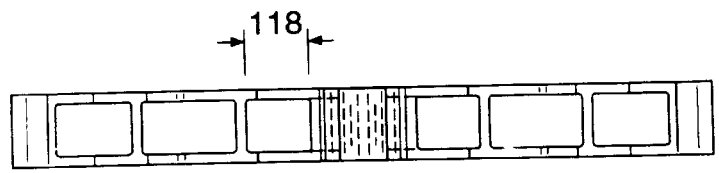
FIG. 14C

COMPLIANT PROCESS CASSETTE

This application claims the benefit of U.S. Provisional Application No. 60/024,999 filed Aug. 29, 1996, which is incorporated herein by reference.

BACKGROUND OF THE INVENTION

1. Field of the Invention.

The present invention relates to a method and apparatus for handling generally planar objects during multistage processing steps, and specifically, a processing cassette having a flexible structure which is compliant rather than rigid.

2. Description of the Related Art.

A variety of high technology products are currently formed by subjecting a surface of a generally planar object to a number of sequential processing steps. Examples of products processed in this manner include optical and magnetic recording disks, photomasks, and silicon wafers from which semiconductor chips are fabricated. For the sake of simplicity, the present invention is discussed below with reference to the manufacture of semiconductor devices from silicon wafers. However, this is not intended to limit in any way the scope of application of the apparatus or method of the present invention.

Surface processing of silicon wafers to make semiconductor devices such as integrated circuits involves a number of stages, with the wafers being exposed to many different processing steps. Wafers are placed in tanks at work stations where they are repeatedly subjected to heated chemicals, such as sulfuric acid. The wafers are also rinsed and cleaned between processing steps. For optimum process performance, it has become customary for the wafers to be confined within specially-constructed relatively low mass cassettes having customized interfaces with the tanks into which the cassettes are placed, and with the robots or other machinery for transporting the cassettes.

In general, the wafers are arranged in a linear array configuration within the cassette, with sufficient space between each wafer to allow exposure to the various chemicals necessary for processing, and to prevent contact with adjacent wafers. The cassette is typically rigid in order to maintain the required spacing between the wafers, even under the relatively high temperatures to which the cassette is exposed.

One of the most common wafer cassette designs currently used is the rigid four-bar cassette shown in FIGS. 1A–1C. Such a prior art cassette is described in U.S. Pat. No. 4,872,554. FIGS. 1A–1C show perspective, top, and end views, respectively, of a conventional rigid four-bar wafer cassette. Rigid endplates 2 secure the ends of each of the rigid bars or rods 3. Rigid bars 3 have combs or "teeth" 4 adapted to accept and separate inserted wafer(s) 5. An inserted wafer is intended to come into contact with cassette 1 at four different points 6, as shown in FIG. 1C. The wafer's position is statically indeterminate, and in practice wafer 5 typically maintains contact with combs 4 on only three of the four bars of the conventional cassette.

Because the conventional four-bar structure is rigid, the cassette must be loaded and transported facing upwardly, otherwise the wafers fall out. Also, the separation of the wafers within the cassette (called the wafer "pitch") is greater than is desired because when such a conventional cassette is loaded into a tank of hot liquid, thermal expansion causes the cassette to expand so that the wafers become "looser" and tend to lean. Thus additional space must be provided between the wafers to ensure that they do not contact each other.

The traditional four-bar cassette of FIGS. 1A–1C is picked up and transported using handles 7. This requires a relatively complicated gripping arrangement to transport a cassette. The four-bar cassette design has other disadvantages which will become apparent in the description of the present invention which follows.

Wafer cassettes have been created using a number of different materials, and for the purposes of the invention the material from which the cassette is made is not critical. That is, once the compliant cassette concept of the invention is understood, those skilled in the art will readily understand how such a cassette could be formed from any number of materials. I have found, however, that currently the most desirable material for wafer carriers is PFA (perfluoroalkoxy) Teflon brand material (hereinafter referred to for simplicity as PFA). PFA exhibits high resistance to a broad variety of chemicals, and is not readily contaminated by other materials. PFA is thus preferred for ultra clean applications such as the fabrication of semiconductors. However, PFA does have less than optimal structural properties and a high coefficient of thermal expansion.

Alternative materials used for rigid process cassettes include fused quartz. Unfortunately, fused quartz is fragile and susceptible to etching by some chemicals commonly utilized in wafer processing.

SUMMARY OF THE INVENTION

The present invention provides an improved cassette design allowing PFA and other cassettes to be used in high temperature processing steps. Unlike the prior art, the cassette in accordance with the present invention is designed to be compliant and to flex, utilizing the inserted generally planar objects, such as semiconductor wafers, as structural components.

In accordance with the invention, a minimum of three support bars or rods are necessary. Since these three points define a plane, this means that the individual flat materials may be contacted by the cassette and held at only three points. The support rods are held together by endpieces which flex and provide a compliant cassette structure.

In the preferred embodiment of the present invention, a cassette for holding silicon wafers during semiconductor fabrication processing has three support rods located at approximately 3, 6 and 9 o'clock when the cassette is viewed "end on". These rods can be parallel to one another, though this is not required. When a wafer is inserted within the cassette, the flexed structure exerts a force to hold the individual wafers in place, even during processing in hot liquids. In effect, the wafers themselves act as structural elements to form a structurally stable cassette/wafer combination.

Since the individual wafers are more effectively gripped or clamped even during high temperature processing, the pitch of the wafers can be reduced (i.e. the wafers may be brought closer together). This means that more wafers can be processed at the same time, resulting in enhanced process efficiency and the consumption of smaller quantities of processing materials.

The compliant cassette structure of the present invention also allows the cassette/wafer combination to be used horizontally, rather than vertically. That is, the wafers in the cassette can be oriented horizontally when processed. Horizontal arrangement of inserted wafers allows operations like loading the cassette, to take place with the wafers in a horizontal plane.

A better understanding of the features and advantages of the present invention will be obtained by reference to the detailed description and accompanying drawings given below. The following description and drawings illustrate a compliant three-bar cassette useful for transporting silicon wafers during semiconductor processing steps. However, it is important to recognize that this three-bar cassette design represents only one particular embodiment utilizing principles of the present invention.

BRIEF DESCRIPTION OF THE DRAWINGS

The invention will be better understood by reference to the appended figures, in which:

FIGS. 14A–14D provide dimensions for one actual embodiment of the endplate of the three-bar cassette in accordance with the present invention.

DETAILED DESCRIPTION

As discussed above, a number of relatively flat or planar objects are suitable for handling during multi-stage processing by utilizing a compliant cassette in accordance with the present invention. For illustrative purposes, a compliant cassette for handling silicon wafers is shown below.

Figure 1A:
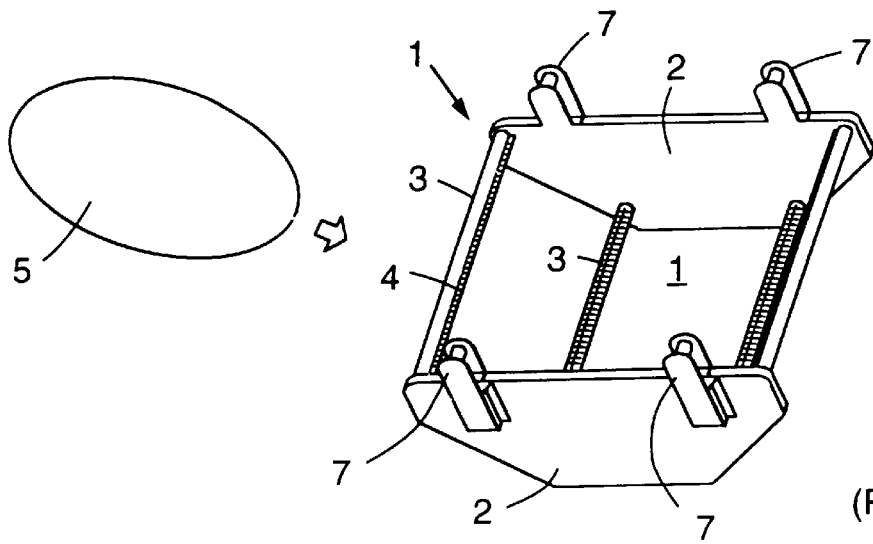
FIGS. 1A–1C show views of a conventional rigid four-bar wafer cassette.
Figure 1B:
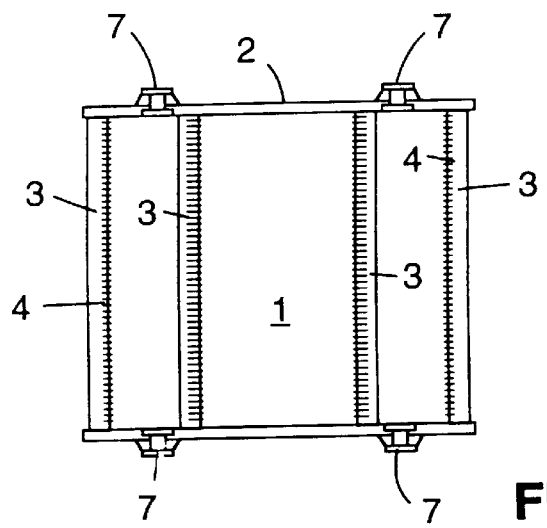
Figure 1C:
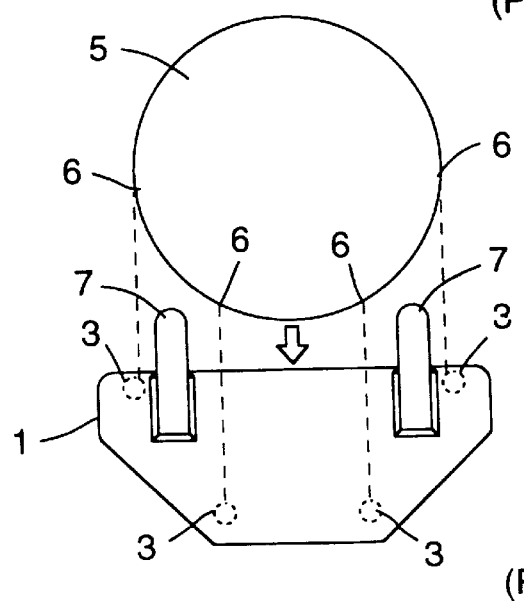
Figure 2A:
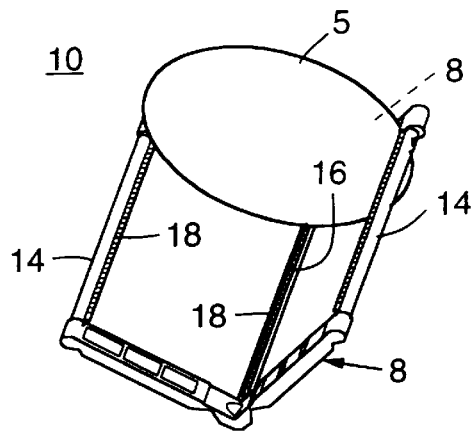
FIGS. 2A–2D show perspective, top, exploded and end views, respectively, of a compliant three-bar wafer cassette in accordance with one embodiment of the present invention.
Figure 2B:
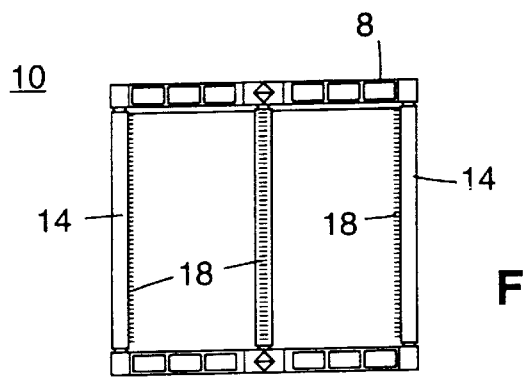
Figure 2C:
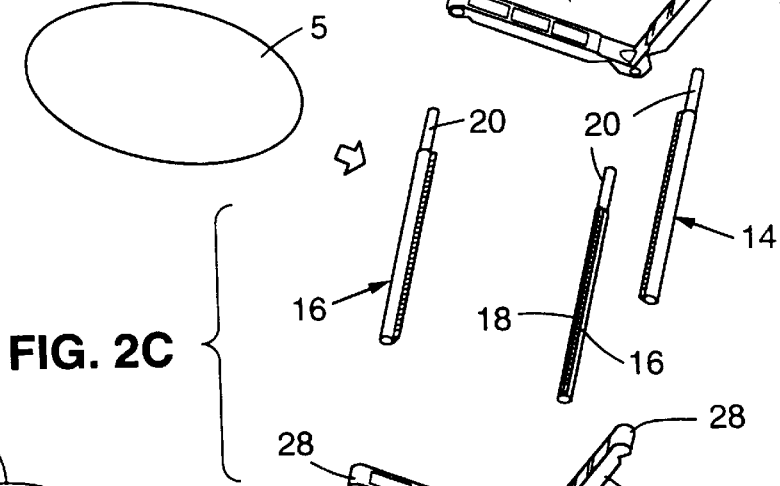

Referring to FIGS. 2A–2C, compliant three-bar process cassette 10 includes two "wishbone"-shaped endpieces 12 which secure the ends of parallel rigid side bars or rods 14 and a third parallel rigid center bar or rod 16. It will be understood that the term "wishbone" as used in this disclosure refers to the fact that the endpieces of the preferred embodiment, in an end view, are similar in shape to the well recognized forked bone found in most birds near the breastbone, and commonly referred to as a "wishbone".

In the normal processing position (as can be seen in view 2D) the center bar is at substantially 6 o'clock, and the two side bars are at substantially 3 o'clock and 9 o'clock, respectively. In this position, the center bar carries most of the weight of wafer(s) 5, which are inserted into cassette 10 as shown and are held and spaced apart from one another by a comb-like or teethed structure 18. The comb structure 18 is desirably fabricated from an integral PFA material, in the conventional manner. Since PFA is flexible, a relatively rigid structural rod 20 maintains the alignment of comb 18 as is well known in the art.

Endpieces 12 are composed of arms 22 and 24 connected to a bar-securing portion 26 which connects the center bar 16. The distal ends 28 of arms 22 and 24 secure side bars 14.

Figure 2D:
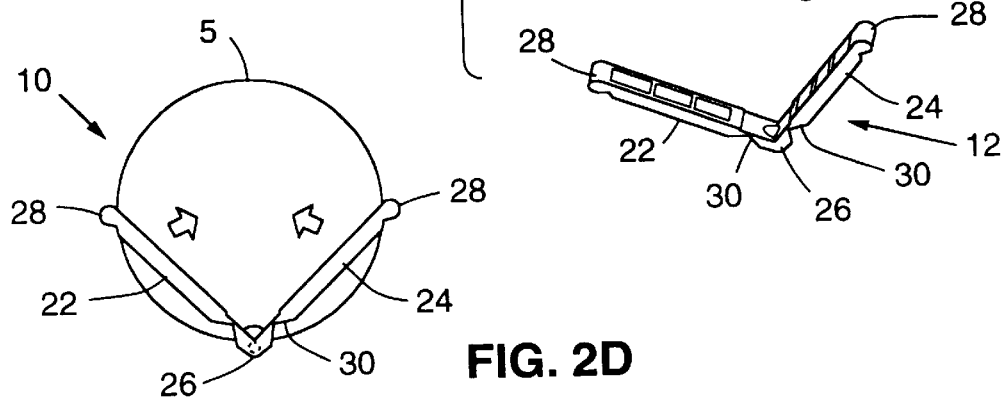

Arms 22 and 24 are flexible so they can move toward and away from wafer(s) 5. This is accomplished in one embodiment by providing a narrowed section or living hinge 30 in each arm 22 and 24 near the bar-securing portion 26. As shown in FIG. 2D, when a wafer is inserted into cassette 10 the side bars 14 flex, causing a clamping force on the wafer, as indicated by the arrows. It will be understood that the thickness of the hinge portion can be adjusted to adjust the degree to which the arms flex as a wafer is inserted. It should also be understood that other hinge arrangements which accomplish this same objective (provided tensioned flexibility between the side rods), could also be used. An example would be a single hinge point at the base of the two arms around which the arms would rotate. In this arrangement a spring mechanism could be used to tension the hinge point.

Figure 3A:
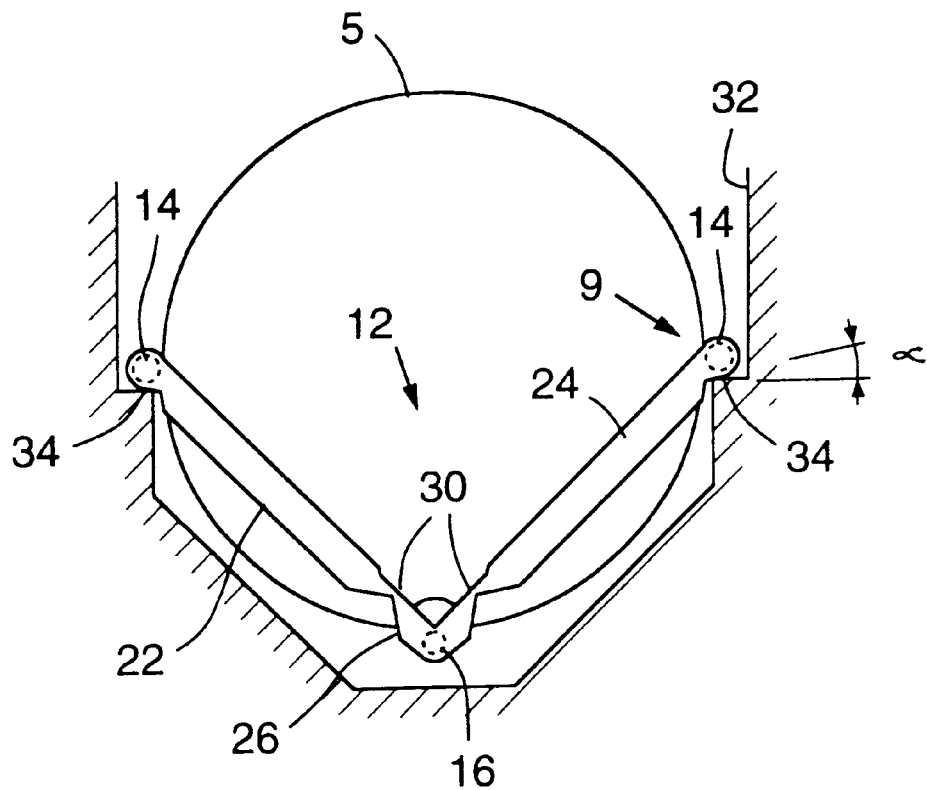
FIGS. 3A and 3B show a simplified force diagram of a compliant three-bar wafer cassette in accordance with one embodiment of the present invention.
Figure 3B:
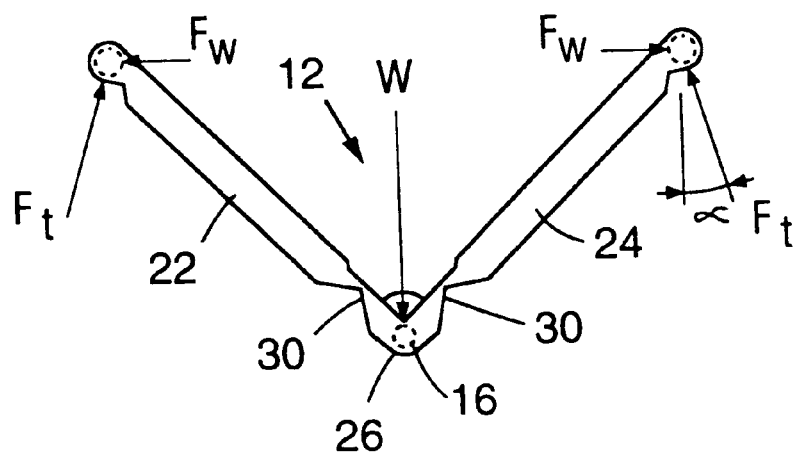

Operation of cassette 10 in accordance with one embodiment of the present invention is best understood with reference to FIGS. 3A and 3B simplified force diagrams. Cassette 10 is intended to be engaged and transported via robot and supported in a processing tank 32 via side bars 14. Specifically, side bars 14 rest on sides or shelves 34 of tank 32 and support the cassette 10.

The weight W of inserted wafers 5 is borne solely by center bar 16. Weight W upon center bar 16 is translated from bar-securing portion 26, through living hinges 30, to arms 22 and 24, and then to side bars 14. Sides 34 of tank 32 then provide a reaction force $F_r$. The horizontal component of $F_r$ is translated by side bars 14 into a clamping force upon on wafers 5. Wafers 5 resist this horizontal clamping force with a resistive force $F_w$.

The result of this configuration is that when cassette 10 is placed into tank 32, side bars 14 are biased toward wafers 5, exerting a clamping force. Inserted wafers 5 are held securely in place by this clamping force, and in response exert a resistive force $F_w$.

The flexible and compliant character intentionally designed into cassette structure 10 permits the translation of forces acting upon cassette 10 to create clamping forces upon the wafers 5 as described above. In this manner, cassette 10 takes advantage of flexion in endpieces 12 to utilize the wafers 5 as a structural component. In other words, when the wafers are inserted within the cassette 10, the wafer/cassette combination becomes structurally stable.

Because the clamping force is due to weight W of the wafers, the resistive force $F_w$ required by each wafer within the cassette will be uniform regardless of the number of wafers in the cassette. Thus it is seen that the addition of more wafers into the cassette will not dramatically increase the clamping force on each wafer, as the number of wafers available to bear the clamping force will also increase.

The magnitude of $F_w$ can be controlled by changing the angle alpha a at which sides 34 of tank 32 contact side bars 14. A larger angle alpha generates higher clamping forces upon the wafers 5. Precise control of this clamping force is desirable in order to counteract buoyant, viscous, and pressure forces acting upon the cassette and wafers, while ensuring that the clamping force remains less than the allowable stress limits of the wafers.

FIGS. 4A–4C and FIG. 5 show another preferred embodiment 40 of the compliant process cassette of the present invention. Cassette 40 is similar to above-described cassette 10 and the same reference numerals are used where the parts are identical. Process cassette 40 has endpieces or endplates 42, each of which includes an inverted V-shaped bridge element 44 additionally connected between arms 22 and 24. As explained in greater detail below, bridges 44 serve as engagement points for robotic equipment used to transfer cassette 40 to the various processing sites.

Figure 10:
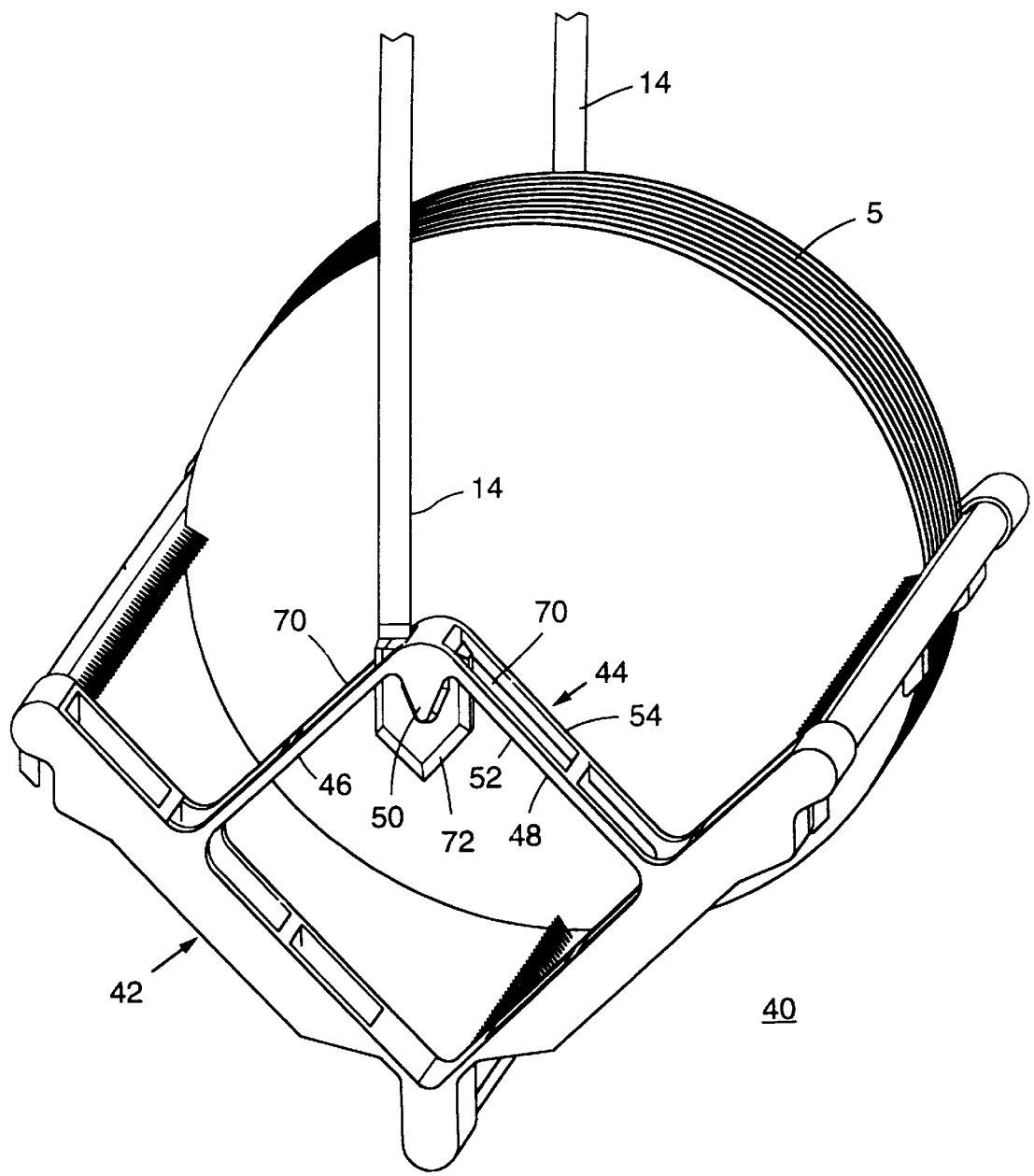
FIG. 10 shows an isolated view, in perspective, of the compliant three-bar cassette of the present invention, as it is engaged by robot end effectors.
Figure 11:
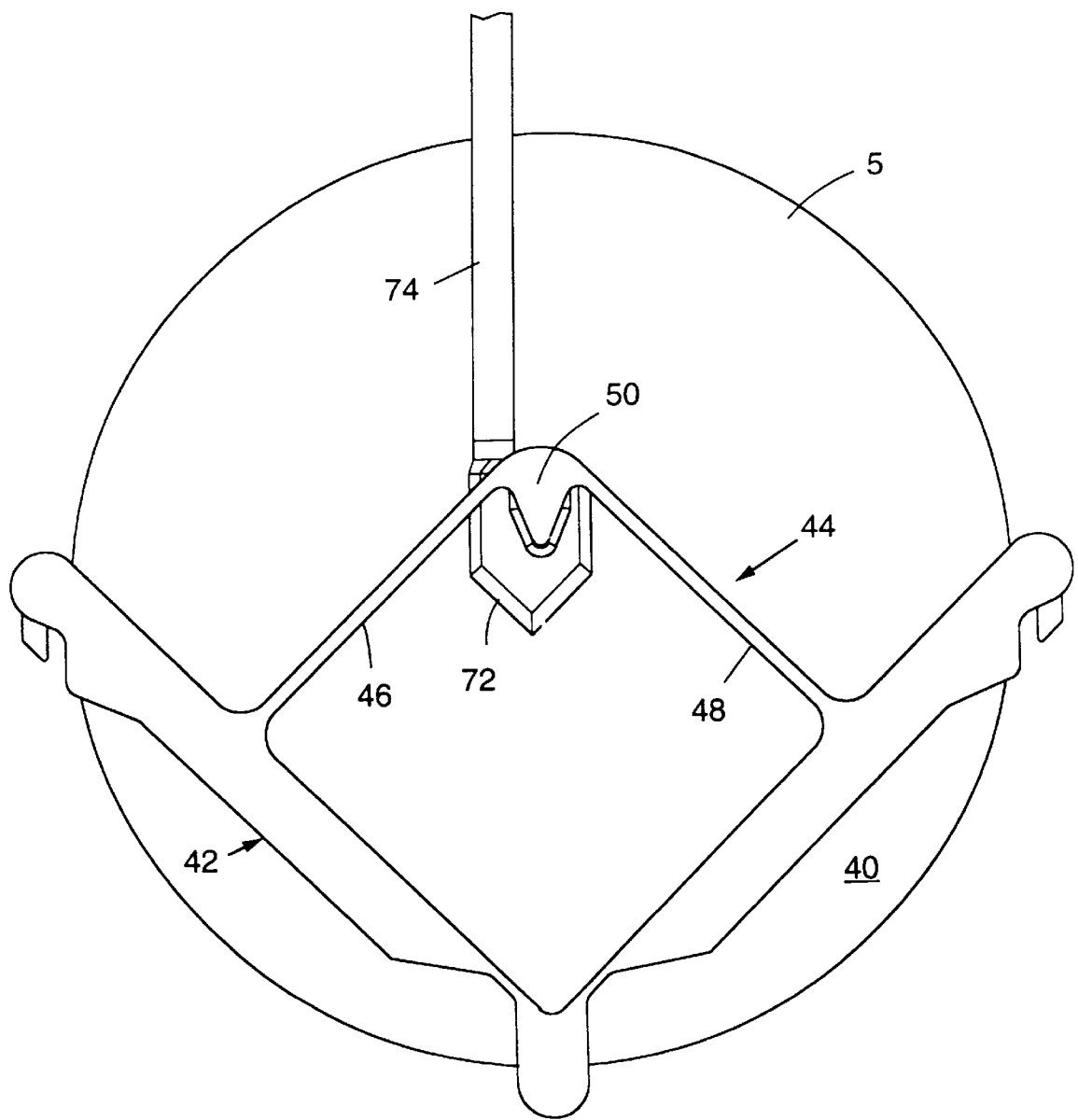
FIG. 11 shows an end view of the compliant three-bar cassette of FIG. 10.

Each of the two bridges 44 is made up of two legs 46 and 48, and a triangular or v-shaped contact point 50. Contact point 50 interfaces with a robot end effector hook (FIGS. 10–11). Each leg 46 and 48 is made up of small struts 52 and 54, joined by a supporting rib 56. Small struts 52 and 54 accomplish both tensile and flexural loading.

Bridges 44, like arms 22 and 24, are flexible. The small members 52 and 54 act as living hinges over their entire length. When fully deformed, each leg 46 and 48 of the bridge 44 take on somewhat of an "S"-shape which further illustrates that the small members 52 and 54 are supporting tensile and moment loading, and ultimately acting as two living hinges for each of leg 46 and 48.

One form of the cassette 40 could be accomplished if actual pinned hinges were used. If so, the endplates would be reduced to four truss members and four pinned hinges (top, bottom, right and left). While such a structure is within the scope of the invention, it would have disadvantages for some uses. One problem would be cleanliness. It would be difficult to rinse and dry the hinge areas. In the preferred embodiment, the use of living hinges both in the bridge 44 as well as the arms 22 and 24 (which are fabricated as integral parts of the endpieces) makes cleaning and rinsing the cassette easier. Also, assembly is easier and requires less stringent tolerances during fabrication of the parts.

Together with remainder of endpieces 42, the bridges can function to control the amount of compliance or flex of the cassette 40. The size and shape of the bridges, the location of the bridges, and the angle formed by the legs 46 and 48, affect the compliance or flexural motion of the cassette. For example, if the bridge is too flat with respect to a horizontal plane, when the cassette is picked up by the robot the compliant motion and clamping force on the wafers is very high. But if the bridge is made too tall, then the compliant motion and the clamping force on the wafers may not be able to overcome thermal expansion when the cassette is processed in hot chemicals. In this latter case, the cassette grows due to thermal expansion more than the compliant nature of the cassette can pull it back. The result is a poor grip upon the wafers by the cassette.

Another consideration in the design of the compliant cassette 40 is the effect of buoyant forces on the cassette during processing. The cassette weighs approximately 80% less when submerged in sulfuric acid as compared with air, due to buoyant forces. The compliance of the cassette is greatly reduced when buoyant forces are present. However, the cassette must be sufficiently compliant to maintain a firm grip on wafers at elevated process temperatures (thermally expanded) while submerged in sulfuric acid having a specific gravity of 1.6. If, on the other hand, the cassette is too compliant, difficulties would be encountered handling the cassette with robotic equipment, where buoyant forces are non-existent.

Bridges 44 are flexible but serve to stiffen endplates 42 against movement in response to external forces $F_t$ (FIG. 3B). This stiffening function allows further adjustment of the magnitude of resistive force $F_w$ that wafers 5 are required to exert against arms 22 and 24.

Figure 6:
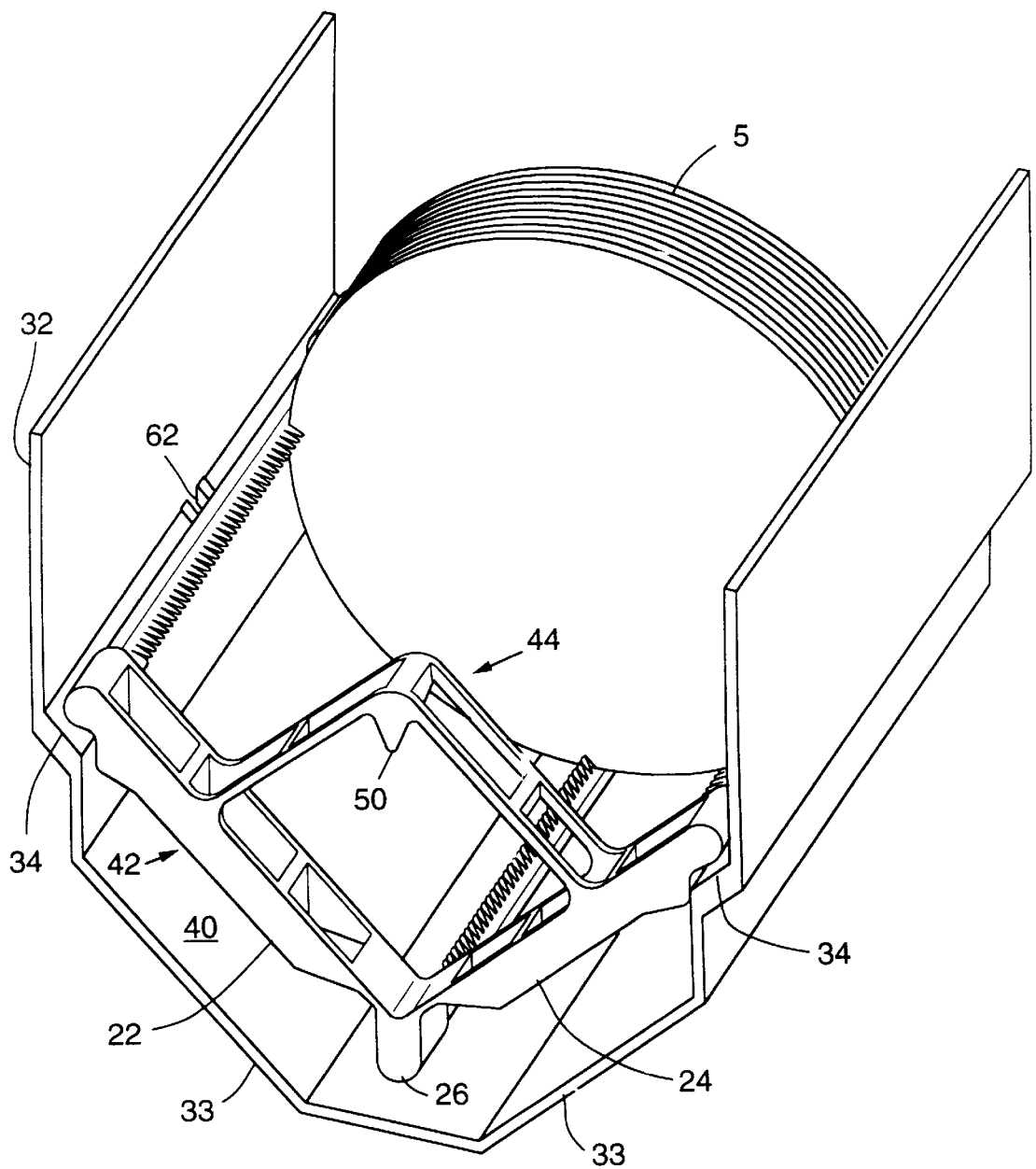
FIG. 6 shows an isolated view, in perspective, of the preferred compliant three-bar cassette of the present invention, positioned within a processing tank.
Figure 7:
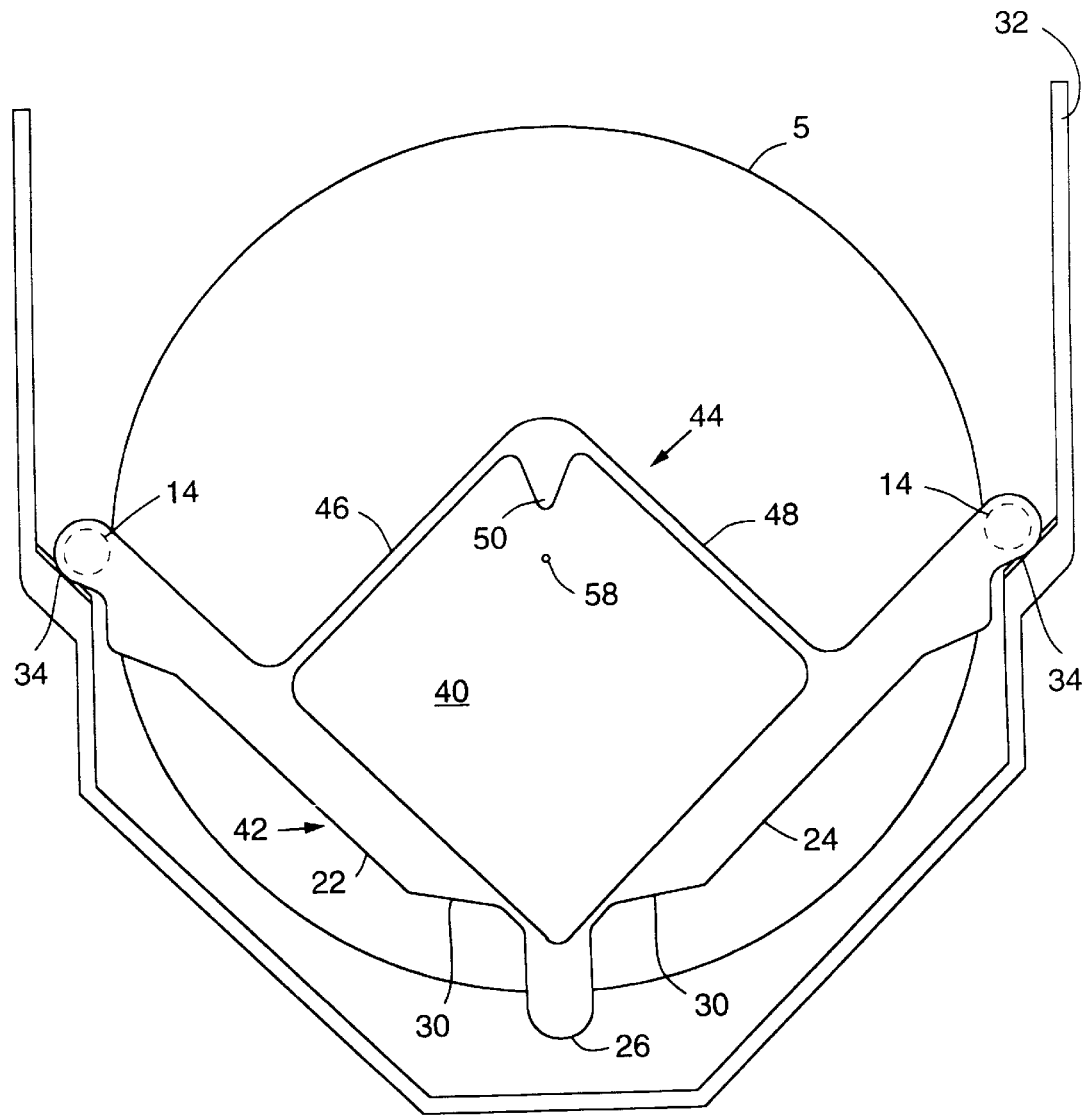
FIG. 7 shows an end view of the compliant three-bar cassette of FIG. 6.

FIGS. 6 and 7 show the cassette 40 in accordance with one embodiment of the present invention, placed within a processing tank 32. The cassette rests at surface or shelf 34 of tank 32. The cassette is supported only by the two side bars 14. This positions the cassette 40 in the x-y plane. The side bars 14 are located above the center 58 of the wafers 5. That is, a line connected between the two side bars 14 passes over the center point 58 of wafer 5. (FIG. 7) This facilitates the clamping action of the compliant cassette of the present invention since a downward vector is created tending to pull the wafer downwardly.

Figure 4A:
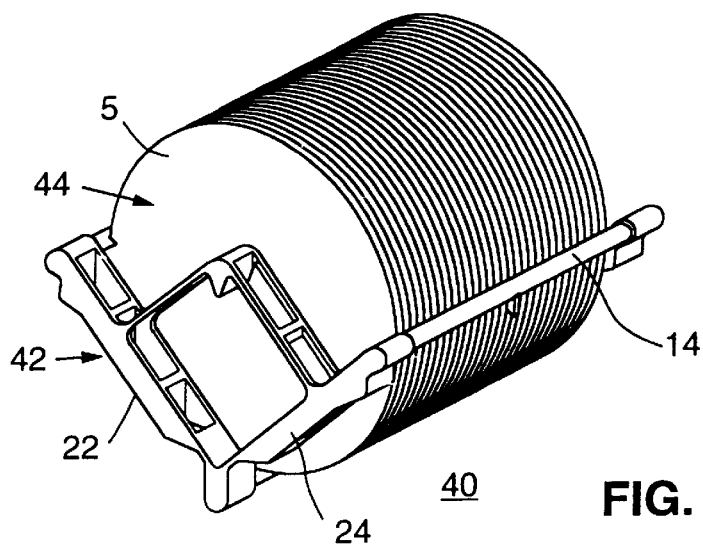
FIG. 4A shows a perspective view of a compliant three-bar wafer cassette in accordance with the preferred embodiment of the present invention, the cassette being fully loaded with wafers.
Figure 4B:
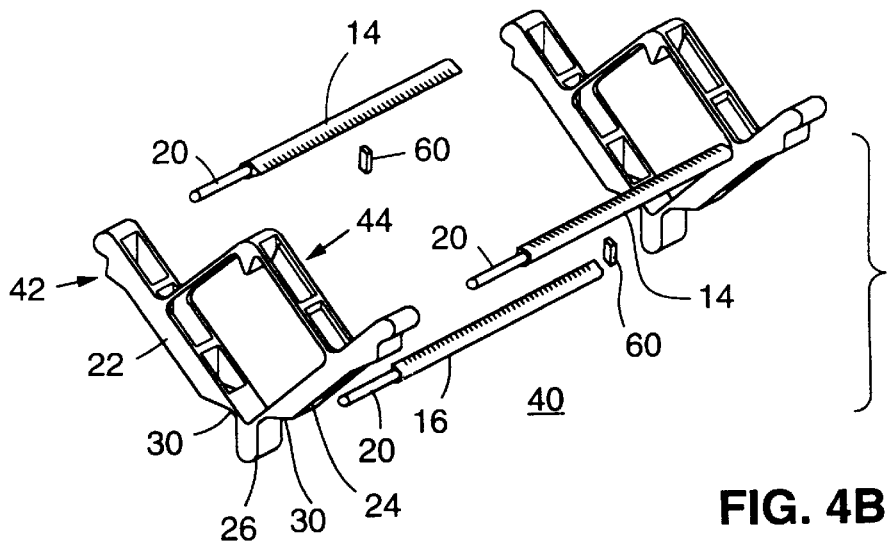
FIG. 4B shows an exploded view of the preferred compliant three-bar cassette of the present invention.
Figure 4C:
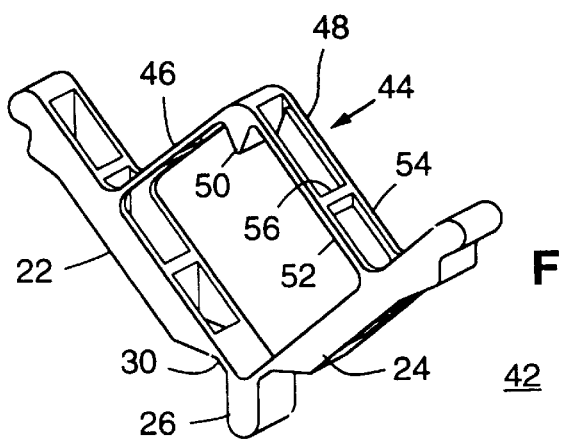
FIG. 4C shows a detailed perspective view of the endpieces of the compliant three-bar cassette of the present invention.
Figure 5:
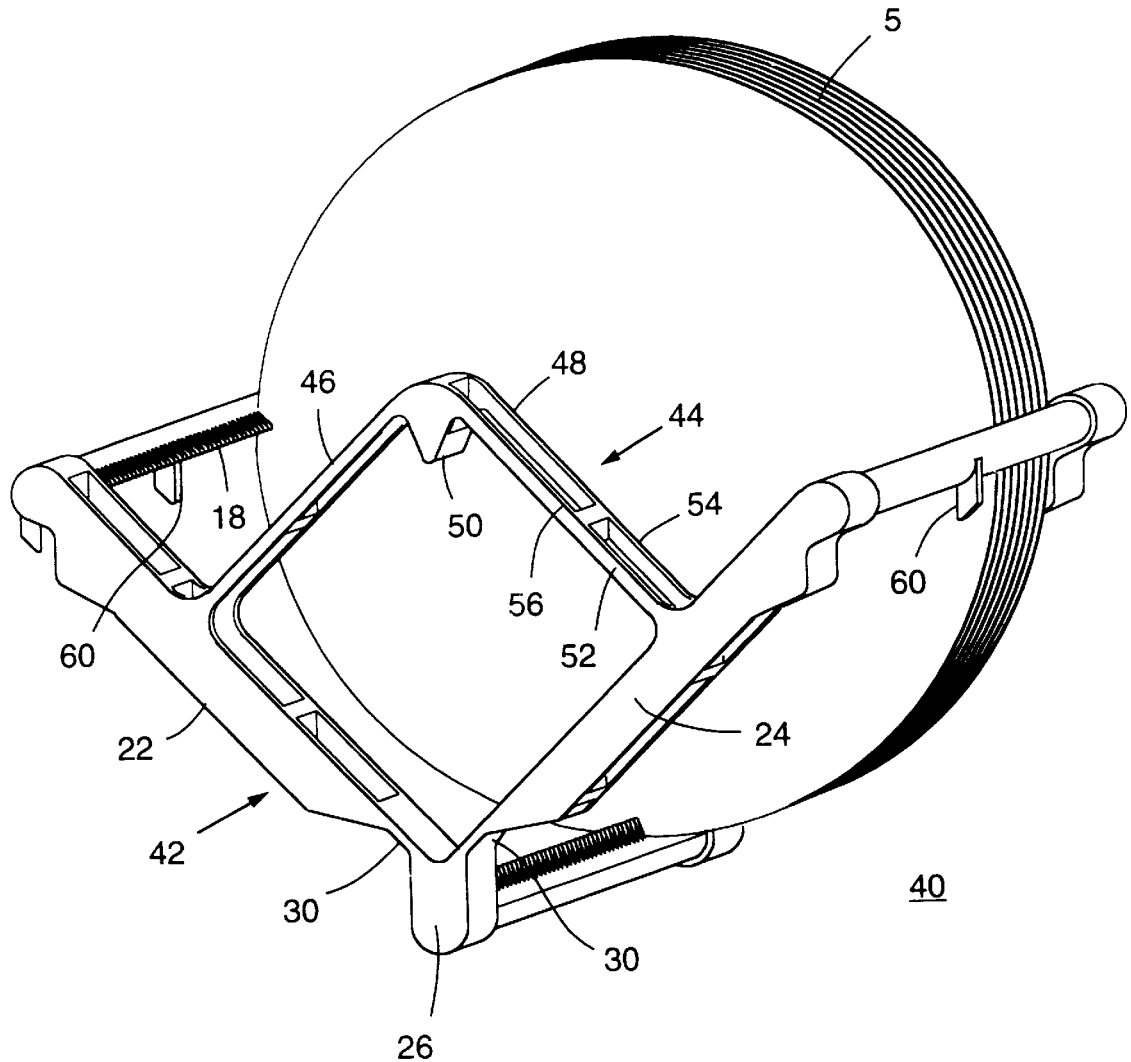
FIG. 5 shows a perspective view of the preferred compliant three-bar cassette, the cassette being partially loaded with wafers.

As noted, for example in FIGS. 4B and 5, tabs 60 are formed from PFA as part of the side bar assemblies. These tabs act to locate the cassette in the z-direction. The tabs 60 engage slots 62 located in the tank shelf 34 to position the cassette fore and aft within the tank 32.

Since the cassette 40 of this embodiment is more compact than a four-rod cassette, the tank 32 can conform more closely to the wafers/cassette. This is reflected in the shape of inclined tank wall 33 relative to cassette 40. Since tank volume is lessened, the use of process fluids is reduced.

Figure 8:
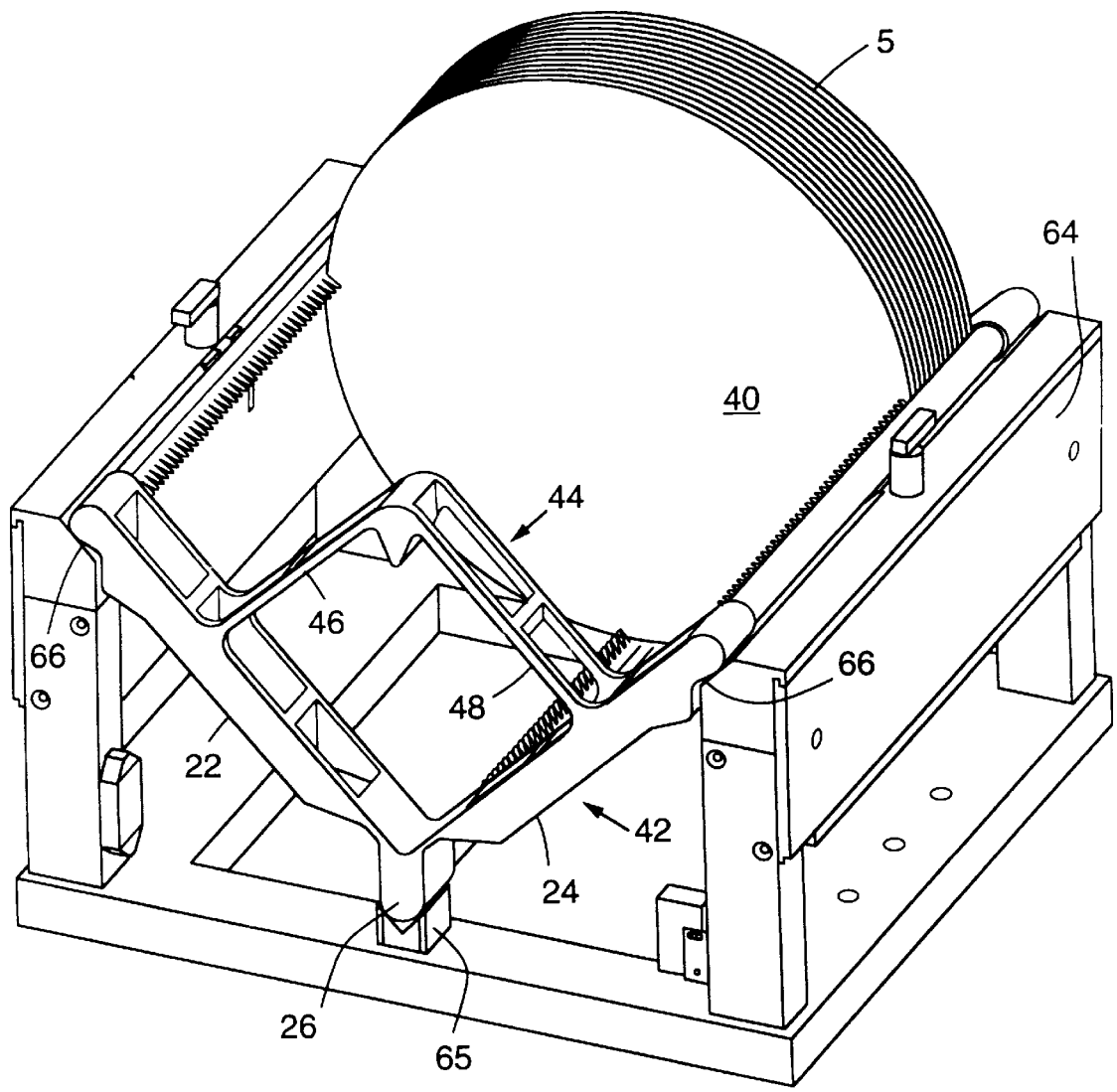
FIG. 8 show an isolated view, in perspective, of the compliant three-bar cassette of the present invention, located on a slide table.
Figure 9:
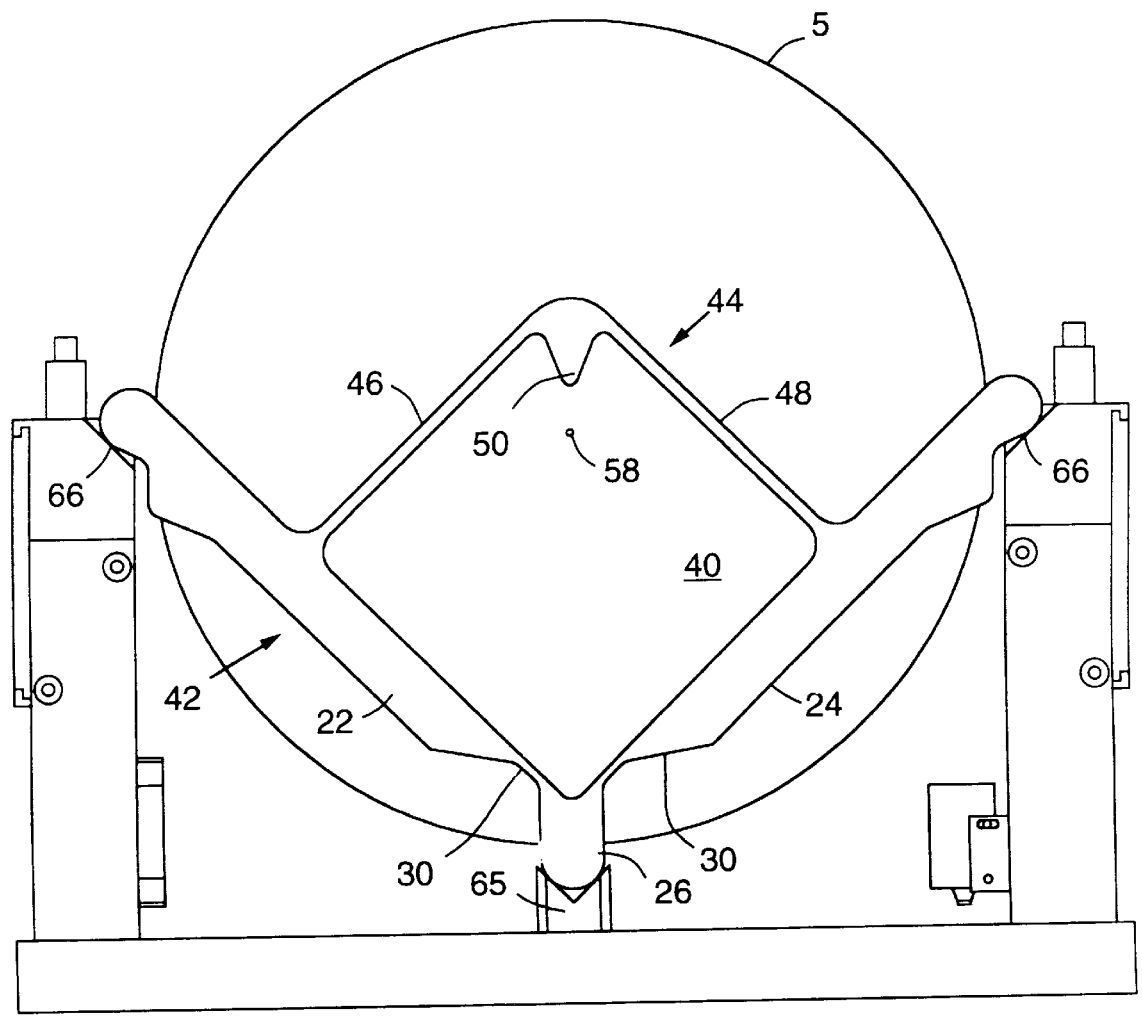
FIG. 9 shows an end view of the compliant three-bar cassette of FIG. 8.

FIGS. 8 and 9 show cassette 40 situated on slide table 64. Note that the bar-securing portion 26 of endplate 42 is supported by support member 65 on table 64, to alleviate the clamping force on the wafers, and allow activities such as the insertion and extraction of the wafers from the cassette. The side bars 14 are supported by shelves 66.

FIGS. 10 and 11 illustrate the manner in which the cassette 40 is engaged and transported by a robotic machine. Each of the thin legs 46 and 48 have openings 70 formed by small members 52 and 54. The hook-shaped gripping end or hook 72 of robotic arm or end effector 74 is V-shaped to mate with the V-shaped triangular part 50 of bridge 44. When the robot end effector 74 passes through the opening 70 between small members 52 and 54, it simply hooks the triangular part 50 of the bridge 44. Only two simple effector/ hooks are required to pickup and transport a cassette. Since the end effectors need to be rinsed and dried quite often to avoid cross contamination during wafer processing, the simple geometry of triangular part 50 in accordance with the present invention, is very desirable.

Figure 12:
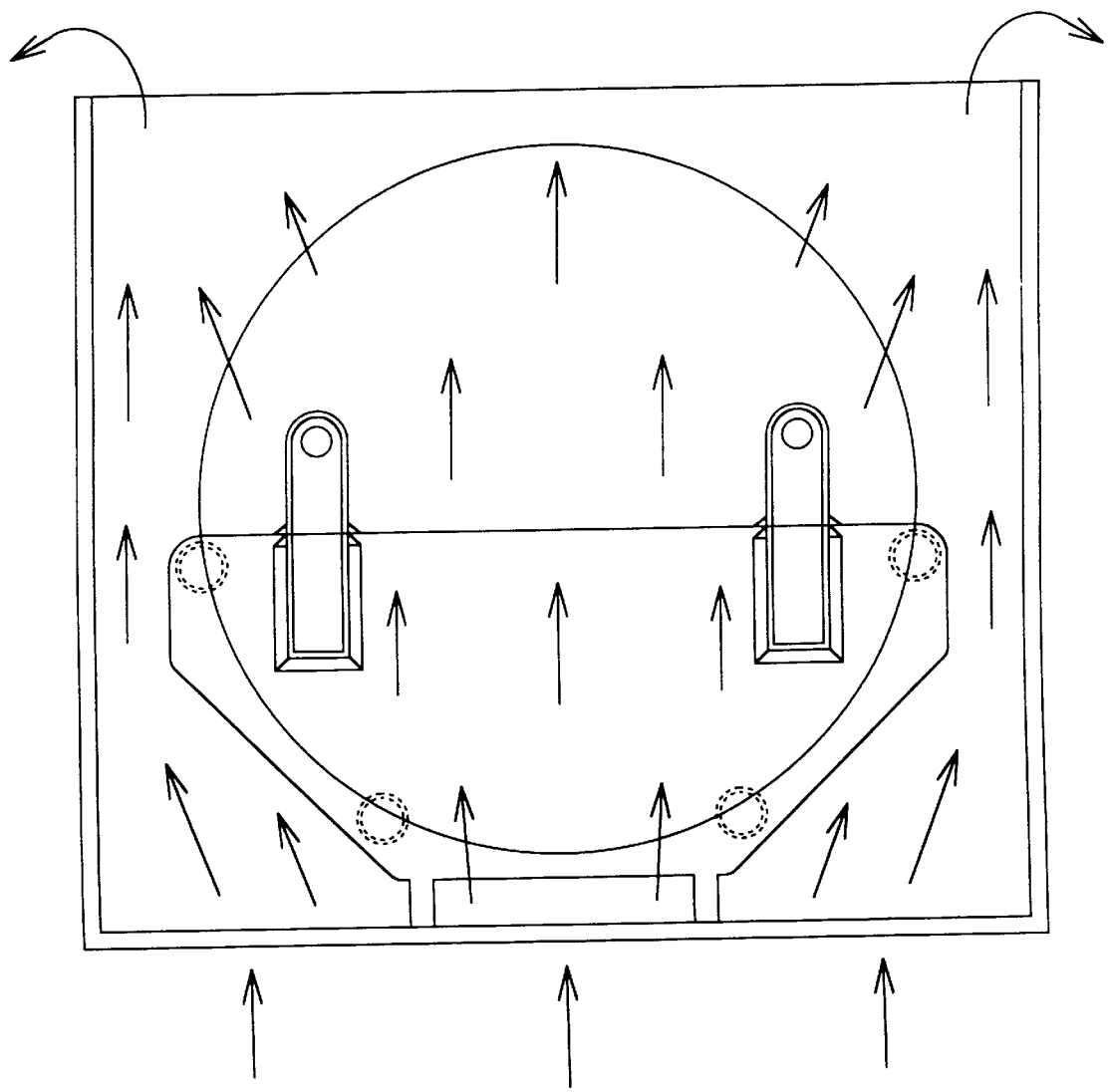
FIG. 12 is a an end view of a conventional rigid four-bar cassette in a liquid processing tank, showing the flow of processing fluids.

FIG. 12 illustrates the flow of processing chemicals in a tank containing a prior art four-bar cassette 1. Chemicals enter through tank 75 at the bottom and flow up through and around the wafers 5 as shown by the arrows. FIG. 12 also indicates that tank 75 includes a gap 76 on each side of the wafers 5, where fluids pass without aiding in the processing of the wafers. This gap 76 is typically about 0.5 to 1 inches. The presence of gap 76 in tank 75 thus results in excess processing fluids being consumed, and reduced process performance.

Figure 13:
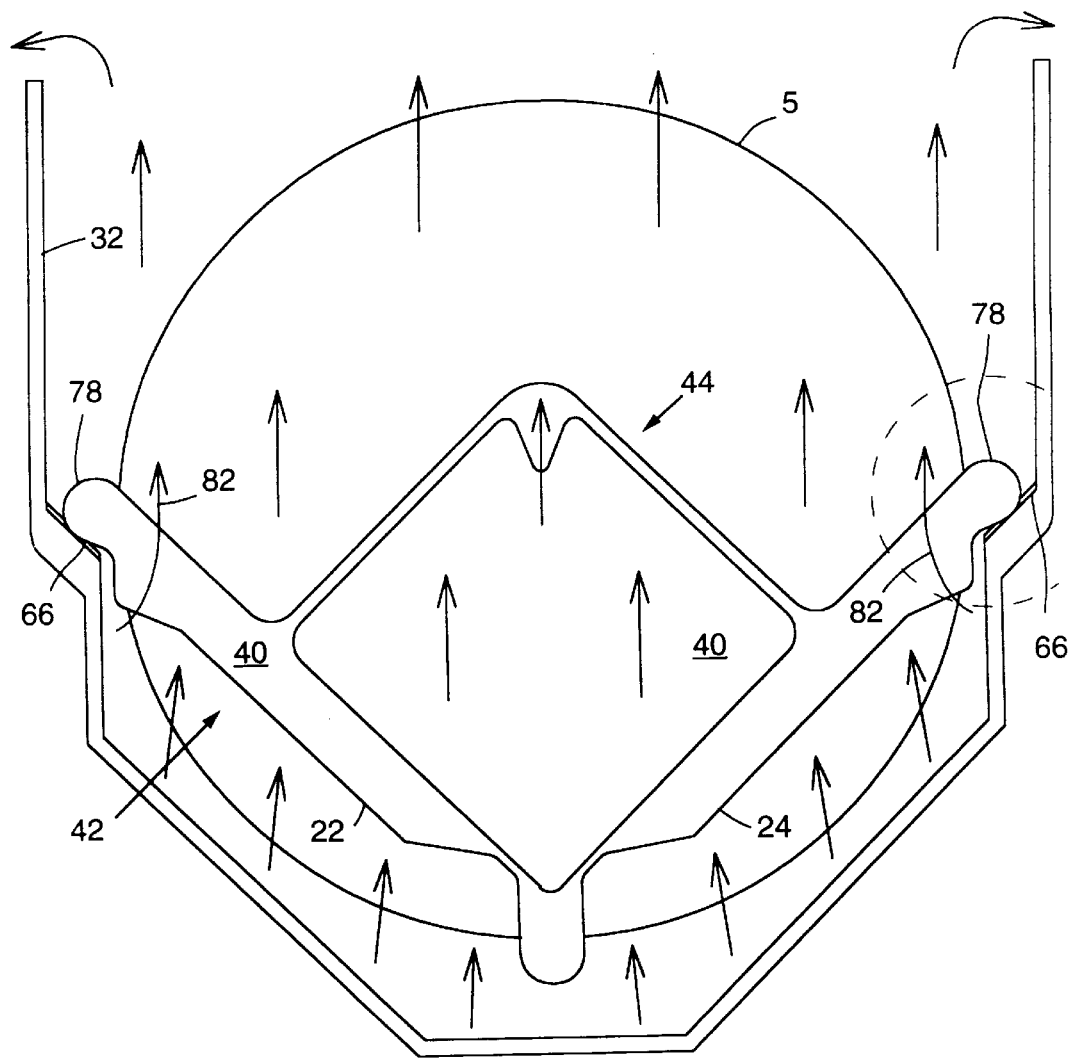
FIG. 13 is an end view of the compliant three-bar cassette in a liquid processing tank, showing the flow of processing fluids.

FIG. 13 shows the flow of fluids through wafers 5 in the improved cassette 40 in accordance with the preferred embodiment of the present invention. Processing tank 32 is specifically constructed such that distal ends 78 of arms 22 and 24 of cassette 40 rest on shelves 66. This purposeful configuration of tank and cassette forms an impediment to the flow of fluids through the processing tank. The presence of distal ends 78 of arms 22 and 24 upon shelves 66 force processing fluids to within and through the wafers 5. This is indicated by the arrow 82. This cassette/tank arrangement maximizes the exposure of wafers within the cassette to the circulating processing fluids, ensuring efficient utilization of these processing fluids and thereby reducing consumption.

In the case of the four-bar cassette shown in FIG. 12, any particles generated by the interface between the feet 84 and cassette 1 are swept up and through the wafers, increasing contamination risk. By contrast, as shown in FIG. 13, because cassette 40 is supported within tank 32 by shelves 66, there are no feet required to support cassette 40 within tank 32, eliminating the feet as a source of contamination.

The design of the wishbone endplate 42 optimizes the clamping force on the wafers, both in a tank and in the robot. In a tank, the angle of the shelf 66 can be altered to change the horizontal component of the resultant vector (FIG. 3B). Likewise, while being supported by the robot, the angle between the bridge sides 46 and 48 and the arms 22 and 24 can be altered in order to change the horizontal component of the resultant vector. obviously, these features must be designed into the cassette and are not adjustable after the cassette is fabricated.

FIGS. 14A–14D give specific dimensions of the endpiece 42 for one actual embodiment of the cassette in accordance with the present invention used for handling 300 mm semiconductor wafers. TABLE 1 summarizes these dimensions:

TABLE 1

| Ref. # | Dimension | Value |
| --- | --- | --- |
| 84* | width of spacing in arms 22 and 24, and legs 46 and 48 | 1.0" |
| 86 | width of v-shaped contact point 50 | .5" |
| 88 | length of first spacing in legs 46 and 48 | 2.0" |
| 90 | length of second spacing in legs 46 and 48 | 1.75" |
| 92 | length of first spacing in arms 22 and 24 | 1.438" |
| 94* | width of arms 22 and 24, and legs 46 and 48 | 1.375" |
| 96* | width of struts 52 and 54, and solid portion of arms 22 and 24 | .188" |
| 98 | width of rib in arms 22 and 24 | .188" |
| 100 | width of supporting rib 56 in legs 46 and 48 | .188" |
| 102 | radius of all inside corners | 32X R.125" |
| 104* | height of struts 52 and 54 | .188" |
| 106* | length of struts 52 and 54 | 6.313" |
| 108 | lateral distance between center bar 16 and distal end 78 | 6.218" |
| 110* | angle defined by arms 22 and 24 | 90° |
| 111* | radius between legs 46 and 48 and arms 22 and 24 | 4X R.500" |
| 112 | width of distal end 78, and arms 22 and 24 | .875" |
| 114 | vertical distance between bar-securing portion 26 and distal end 78 | 6.468" |

TABLE 1-continued

| Ref. # | Dimension | Value |
| --- | --- | --- |
| 116 | distance between bar-securing portion 26 and top of v-shaped contact point 50 | 8.686" |
| 118 | length of third spacing of arms 22 and 24 | 1.250" |

(figures marked with an * represent dimensions which affect the extent of cassette compliance)

Figure 15A:
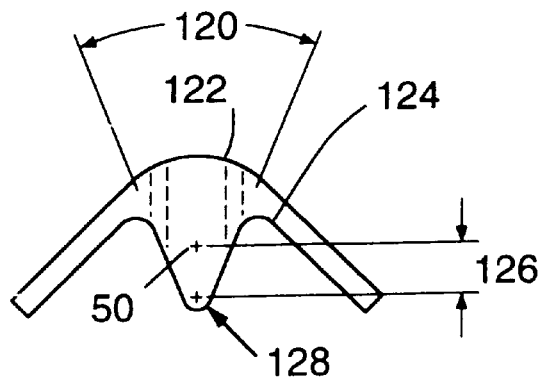
FIGS. 15A–15C shows further dimensions of details of the endplate of FIGS. 14A–14D.
Figure 15B:
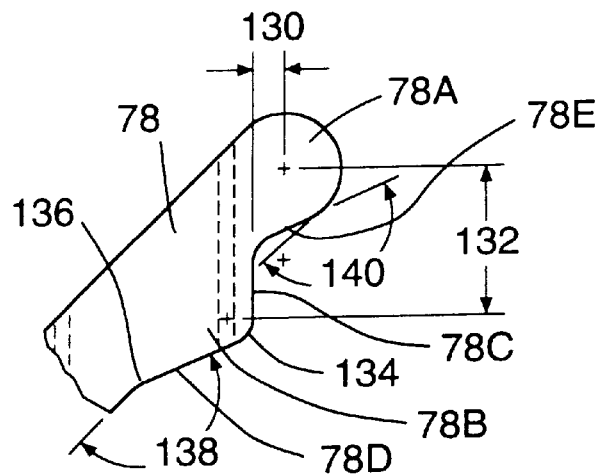
Figure 15C:
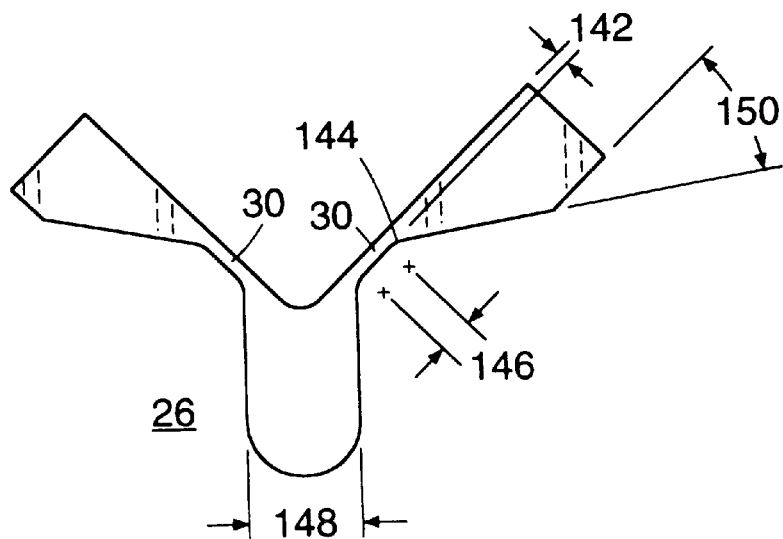

FIGS. 15A–15C show detailed views of various portions of endpiece 46, along with dimensions. FIG. 15A shows a detailed view of the v-shaped contact point 50 of bridge 44. FIG. 15B shows a detailed view of distal end 78 of arm 24. Distal end 78 of arm 24 is seen to include a rounded side bar-securing portion 78A, and a shelf-engaging projection 78B having shelf-engaging face 78C and first and second non shelf-engaging faces 78D and 78E. FIG. 15C shows a detailed view of the bar-securing portion 26, connected to arms 22 and 24 by living hinges 30. The dimensions from FIGS. 15A–15C are summarized in TABLE 2.

TABLE 2

| Ref # | Dimension | Value |
| --- | --- | --- |
| 120 | central angle of v-shaped contact point 50 | 45° |
| 122 | outside radius of top of bridge 44 | R.750" |
| 124* | radius between v-shaped contact point 50 and leg 48 | 2X R.188" |
| 126 | distance between center and tip of v-shaped contact point 50 | .406" |
| 128 | radius of tip of contact point 50 | R.094" |
| 130 | lateral distance between center of side bar-securing portion 78A and shelf-engaging face 78C | .250" |
| 132 | vertical distance between center of side bar-securing portion 78A and center of 78B tip radius | 1.250" |
| 134 | radius of tip of 78B | R.188" |
| 136 | radius between 78B and arm 24 | 2X R.250" |
| 138 | angle between shelf-engaging face 78D and arm 24 | 160° |
| 140 | angle between non shelf-engaging face 78E and arm 24 | 160° |
| 142* | thickness of living hinge 30 | 2X .100" |
| 144* | radius at living hinge 30 | 5X R.250" |
| 146* | length of living hinge 30 | 2X .250" |
| 148 | width of bar-securing portion 26 | .875" |
| 150 | angle between 24 and undercut face | 35° |

(figures marked with an * represent-dimensions which affect the extent of cassette compliance)

In examining the above figures, it is important to recognize that the above description focuses exclusively upon preferred embodiments of the present invention. However, a number of variations upon this basic design are also part of the present invention.

For example, a cassette in accordance with the present invention may have more than three bars, so long as the bars are configured to form a compliant structure utilizing inserted wafers as structural members. An alternative embodiment would have a four bar structure with bars at three o'clock, fivethirty, six-thirty, and nine o'clock, as viewed from the end.

Furthermore, it should be understood that the bars of the cassette need not be precisely parallel to each other. The bars may be skewed from each other, so long as wafers may be inserted between them in order to fit within the cassette.

In addition, even with the three-bar design described above, the three bars need not be positioned precisely at 3, 6, and 9 o'clock as viewed from the end. Rather, the bars may occupy a variety of spatial arrangements, so long as the bars are joined in a manner that allows them to securely engage inserted wafers.

And while the preferred embodiment of the present invention shows the side bars as being above the center of the inserted wafers, this is not a requirement of the present invention. Other characteristics of the cassette/tank configuration, such as adjustment of the shelf angle, the bridge angle, or the rod position, may also be adjusted to ensure secure contact between the cassette and the inserted wafers.

And finally, while the preferred embodiment of the present invention has focused upon a compliant cassette for holding silicon wafers, a variety of materials, including but not limited to optical and magnetic recording disks, may also be secured during processing steps by the present invention.

Therefore, it is intended that the following claims define the scope of the invention, and that structures within the scope of these claims and their equivalents be covered thereby.

What is claimed is:

1. A compliant cassette for holding and transporting at least one substantially planar object, said cassette comprising:

two side bars having comb projections;

a center bar substantially parallel with the side bars positioned below the side bars and at approximately an equal distance between the side bars, the center bar also having comb projections; and two endpieces each comprising center bar-securing portions for securing the respective ends of the center bar, and two arms radiating from and hingedly attached to the center bar-securing portion, with distal portions of the two arms securing the respective ends of the side bars, the two arms deflectable to a clamping position in response to placement of a planar object into contact with the side bars, to engage the object.

2. The compliant cassette of claim 1 including means extending between the arms to control the degree of compliance thereof.

3. A compliant cassette for holding and transporting at least one substantially planar object, said cassette comprising:

two side bars having comb projections;

a center bar substantially parallel with the side bars positioned below the side bars and at approximately an equal distance between the side bars, the center bar also having comb projections; and two endpieces each comprising center bar-securing portions for securing the respective ends of the center bar, and two arms radiating from and hingedly attached to the center bar-securing portion, with distal portions of the two arms securing the respective ends of the side bars and with the arms of each endpiece joined by a flexible bridge member.

4. The compliant cassette of claim 2 wherein the bridge members include an engaging member for engagement with a cassette lifting device.

5. The compliant cassette of claim 3 wherein the bridge members have an inverted v-shape.

6. The compliant cassette of claim 5 wherein an interior angle an angle of the bridge member is about 45°.

7. A cassette for supporting a plurality of planar objects, comprising:

three rods arranged substantially in parallel with each other;

a comb structure associated with each of the three rigid rods for separating individual ones of the objects; and two end assemblies for securing the ends of each of the three rigid rods, the assemblies each including hinged arms for allowing flexure of two of the rods away from each other, the hinged arms deflectable in response to insertion of objects into contact with the three rods to cause the rods to exert clamping forces against the objects at the contact points.

8. The compliant cassette of claim 7 wherein each hinged arm includes a living hinge.

9. The compliant cassette of claim 7 wherein each hinged arm includes a pinned hinge.

10. A cassette for supporting a plurality of planar objects, comprising:

three rods arranged substantially in parallel with each other;

a comb structure associated with each of the three rigid rods for separating individual ones of the objects; and two end assemblies for securing the ends of each of the three rigid rods, each end assembly including a pair of hinged arms for allowing flexure of two of the rods away from each other, and a flexible bridge extending between each arm in said pair.

11. A cassette as in claim 10 wherein the bridge is generally of an inverted v-shape and is adaptable for engagement for lifting and transporting of the cassette.

12. A cassette for maintaining a plurality of semiconductor wafers in close proximity with each other during processing in hot liquid environments comprising:

a structure which engages each of the wafers at three points; and wherein the structure is flexible and wherein the insertion of the wafers within the structure deflects the structure in a manner to cause clamping forces to hold the wafers within the structure during processing.

13. A compliant cassette for carrying objects, said cassette comprising:

a first cassette endpiece having first and second arms, each of said arms having a base end portion and a non-base end portion;

first hinge means positioned between said base portions of said first and second arms for permitting the movement of the non-base portions of said first and second arms relative to one another;

a second cassette endpiece having third and fourth arms, each of said third and fourth arms having a base end portion and a non-base end portion;

second hinge means positioned between said base portions of said third and fourth arms for permitting the movement of the non-base portions of said third and fourth arms relative to one another;

a first bar connecting said base end portions of said arms;

a second bar connecting said non-base portion of said first arm and said non-base portion of said third arm; and a third bar connecting said non-base portion of said second arm and said non-base portion of said fourth arm;

wherein the first and second hinge means are deflectable in response to insertion of objects into contact with the second and third bars, to cause the second and third bars to deflect and exert clamping forces against the objects to clamp the objects within the cassette.

14. A compliant cassette for carrying semiconductor wafers to and from wafer processing tanks, said cassette comprising:

a first cassette endpiece having a first base portion and first and second arms extending from said first base portion;

a first living hinge connecting said first base portion and said first arm;

a second living hinge connecting said first base and said second arm;

a second cassette endpiece having a second base portion and third and fourth arms extending from said second base portion;

a third living hinge connecting said second base portion and said third arm;

a fourth living hinge connecting said second base and said fourth arm;

a first bar connecting said first and second base portions of said first and second cassette endpieces;

a second bar connecting said first arm and said third arm;

a third bar connecting said second arm and said fourth arm wherein the first and second living hinges are deflectable in response to insertion of wafers into contact with the second and third bars, to cause the second and third bars to deflect and to exert clamping forces against the wafers to clamp the wafers within the cassette.

15. A cassette as in claim 14 wherein said arms extend a distance from said base portions such that a straight line drawn across said cassette from said second bar to said third bar, perpendicular to said bars, crosses above the center of a wafer positioned in said cassette.

16. A cassette as in claim 14 wherein said arms extend a distance from said base portions such that a straight line drawn across said cassette from said second bar to said third bar, perpendicular to said bars, crosses below the center of a wafer positioned in said cassette.

17. A compliant cassette for carrying substantially planar objects, comprising:

a pair of flexible end assemblies;

a central support member extending between the end assemblies; and a pair of lateral support members extending between the end assemblies on opposite sides of the central support member, the lateral support members deflectable to a clamping position in response to placement of a planar object into contact with the central and lateral support members, the clamping position being one in which the lateral support members exert clamping forces against planar objects positioned in the cassette.

18. A cassette for supporting a plurality of planar objects, comprising:

a pair of support members each having contact points for contact by planar objects, the support members spaced from one another; and a hinge assembly extending between the support members, the hinge assembly deflectable between first and second positions in response to insertion of objects into contact with the support members to cause the support members to exert clamping forces against the objects at the contact points.

19. A cassette for supporting a plurality of planar objects, comprising:

three rods arranged substantially in parallel with each other; and two end assemblies for securing the ends of each of the three rods, the assemblies each including hinged arms deflectable in response to placement of obiects into contact with the rods for allowing flexure of two of the rods away from each other so as to apply clamping forces against objects placed into contact with the rods.

* * * * *